United States Patent [19]

Hedin et al.

[11] 4,398,269
[45] Aug. 9, 1983

[54] MNOS OVER-WRITE PROTECTION CIRCUITRY

[75] Inventors: Raymond C. Hedin, Apple Valley; Dennis L. Amundson, Bloomington, both of Minn.

[73] Assignee: Sperry Corporation, New York, N.Y.

[21] Appl. No.: 286,224

[22] Filed: Jul. 23, 1981

[51] Int. Cl.³ .............................................. G11C 7/00
[52] U.S. Cl. ................................... 365/195; 365/184
[58] Field of Search ............... 365/184, 185, 194, 195, 365/189, 233; 364/200 MS File

[56] References Cited

U.S. PATENT DOCUMENTS 4,090,258  5/1978  Cricchi ................................. 365/195

OTHER PUBLICATIONS

Foglia et al., "Write-Only Core Memory," IBM Tech. Disc. Bul., vol. 5, No. 1, 6/62, pp. 46-47.

Primary Examiner—Stuart N. Hecker
Attorney, Agent, or Firm—Douglas L. Tschida; Kenneth T. Grace; Marshall M. Truex

[57] ABSTRACT

Apparatus for preventing the writing of data into an MNOS memory during various time intervals, whereby the over-writing and premature fatiguing of the differential voltage separation of the memory cells is prevented. The apparatus comprising an access memory that flags each address when it is first written during a write protect interval so that upon subsequent attempts to write the same address a write abort will occur.

2 Claims, 5 Drawing Figures

MNOS OVER-WRITE PROTECTION CIRCUITRY

BACKGROUND OF THE INVENTION

The present invention relates to mass memories or bulk storage units (BSU) of the metal nitride-oxide semiconductor field effect transistor (MNOS FET) type, and in particular, a BSU having over-write protection.

In the field of semiconductor memories, MNOS memories offer a number of advantages to a circuit designer. In particular, MNOS memories enable the design of a non-volatile solid state memory having a relatively fast access time. While generally these memories are used in a "read mostly mode", their inherent fast access time offers a temptation to the knowledgeable user of using the memory as a "scratch-pad memory" in certain applications.

Such scratch pad use presents a problem, though, in that it will prematurely fatigue the memory. Specifically, each memory cell of the BSU is typically comprised of two MNOS FET's that are coupled so as to exhibit a differential voltage threshold separation. The binary contents of each memory cell (i.e., "0" or "1") thus being dependent upon whether the cell exhibits a voltage in excess or below the threshold separation during the read operation. This threshold separation or "memory window", however, decays at an exponential rate with time and usage, such that each memory cell can typically only be written on the order of $10^8$ writes before its memory window has diminished to the point where the stored data cannot be detected accurately. Therefore, if a user were permitted to use an MNOS type BSU in a scratch pad fashion, he/she could potentially and prematurely fatigue all or a portion of the BSU.

In order to prevent premature fatigue, the present invention during each write protect interval, permits writing each address only once, via an access memory that flags the first writing of each address. Each subsequent attempt then producing a write abort. The present invention thus makes it very difficult for a user to operate the memory in a scratch pad fashion, since any use other than designed for would result in a write abort. The duration of the write-enable intervals also being within the discretion of the designer.

It is therefore a primary object of the present invention to prevent the over-writing of an MNOS type memory.

It is aother object of the present invention to prevent the over-writing via an access memory that permits only one write per protect interval.

These objects and others will become more apparent, however, upon a reading of the following description, as well as the "how to" for accomplishing these objectives.

SUMMARY OF THE INVENTION

A technique and apparatus for preventing the overwriting and concurrent fatiguing of an MNOS memory. The apparatus essentially comprising an overwrite timer and access memory means. The over-write timer essentially establishing a write protect interval during which each access to the BSU is flagged in the access memory means. The access memory means and pertinent logic circuitry, in turn, enabling the writing of the flag for each corresponding address accessed in the BSU and producing a write abort signal, if a user attempts to write the same address more than once during any write protect interval. The write abort signal then interrupting the multiple attempt at writing that address in the BSU.

An alternative embodiment is also disclosed wherein two access memories are shown coupled to the BSU. The access memories in this embodiment operating in an alternate mode such that while one is flagging addresses the other is being initialized so that continuous over-write protection is obtained.

DESCRIPTION OF THE PREFERRED EMBODIMENT

Figure 1:
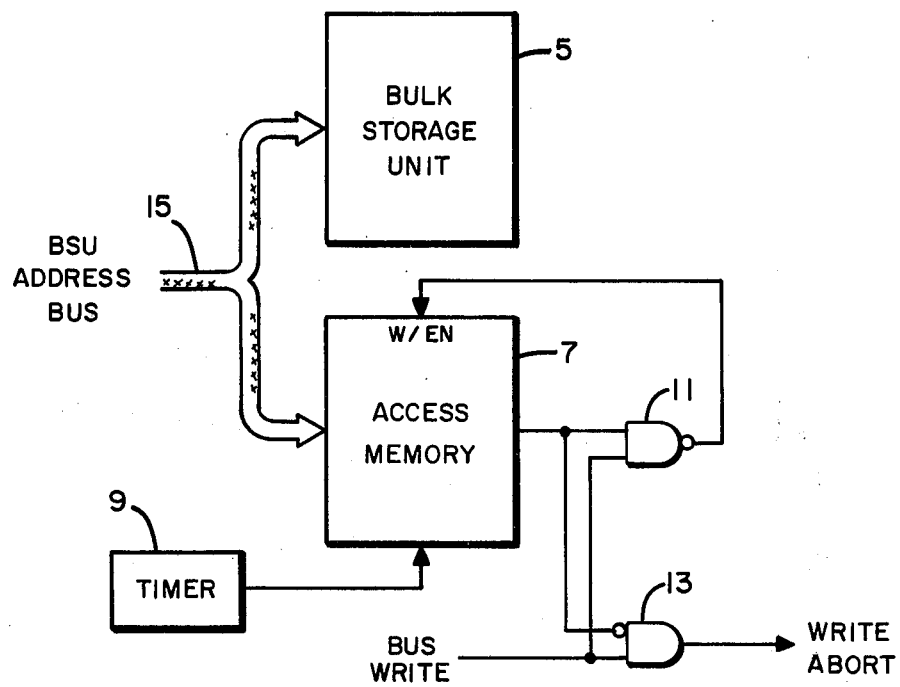
FIG. 1 is a conceptual block diagram of the basic elements of the present over-write protection circuitry.

Referring to FIG. 1, the present invention is shown with respect to its major elements. These are the bulk storage unit (BSU) 5, the access memory 7, the overwrite timer 9 and the logic gates 11 and 13. These elements act to flag each write access that is made to the BSU 5 during any write protect interval via the parallel coupling of each BSU address on the BSU address bus 15 to the BSU 5 and the access memory 7. If any address of the BSU 5 is accessed more than once during any one write protect interval, the corresponding address in the access memory 7 will be read and the flag indicating the previous write operation will be detected. This flag, in turn, will cause the logic gate 13 to be made and produce a write abort signal. The write abort signal then preventing the multiple writing of that address in the BSU 5.

Figure 3:
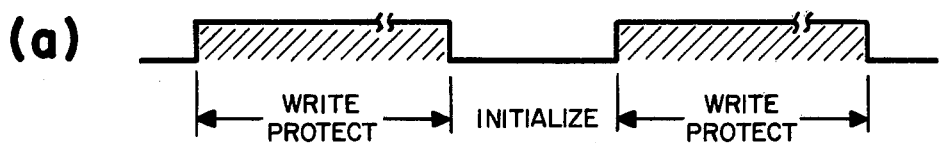
FIG. 3 consisting of (a) through (c) depicts various timing waveforms that would be associated with the alternative embodiments of either FIG. 1 or FIG. 2.
Figure 3:
Figure 3:

Referring to FIG. 3 and specifically waveform (a), the typical timing signal that is produced by the overwrite timer 9 is shown. Each cycle of the timer's signal is generally divided into a write protect period and an initialize period. The duration of the write protect portion of each cycle is typically established by the designer depending upon the application so as to best protect against over zealous writing of the BSU 5 without interferring with the typical operation of the BSU 5. The duration of the initialize period of each cycle then being established to permit the initialization of each address of the access memory 7. This initialization typically requiring the sequential reading of each of the addresses in the access memory 7 and the clearing of the contents stored at these addresses.

Before continuing with the description of the present invention, it should be noted that the BSU 5 is typically comprised of an MNOS-type memory that is used primarily in the read only mode. The access memory 7, however, is typically a MOSRAM that is selected and configured so that each address in the BSU 5 has corresponding address and flag location in the access memory 7. Thus the access memory 7 must have the same number of addresses as the BSU 5, but need only be one bit wide. Each memory location of the BSU 5, on the other hand, may be many bits wide and in the preferred embodiment each memory location of the BSU 5 is typically comprised of seventy-two bits. The BSU 5 further is typically comprised of a plurality of block organized memories, such as the Sperry Univac® SU810 MNOS memory, that are configured in the above fashion.

Returning to the description of FIG. 1, as each address is received on the BSU address bus 15, the access memory 7 is accessed and a binary one is written into the corresponding memory location. For description purposes, too, it will be assumed that a binary one corresponds to a logic low and binary zero corresponds to a logic high. Once a flag has been written into a location in the access memory 7, upon receipt of the same address during the same write protect cycle, a logic low or binary one will be read and impressed on the input to logic gate 13. During a write instruction, a BSU write signal or logic high will also be impressed on the other input to the logic gate 13. Thus, the logic gate 13 will be made and a logic high will be produced that is indicative of a write abort. The write abort signal is then typically coupled to the BSU 5 or a memory controller to disable the BSU 5. If on the other hand, the address received on the BSU address bus 15 had not been previously written, a binary zero or logic high would be detected by the access memory 7 and be impressed on the logic gates 11 and 13. Logic gate 13 would not be made, under these conditions, and a write abort signal would not be produced and the write could occur in the BSU 5.

At the same time though the logic high output from the access memory 7 would cause the logic gate 11 to be made and a logic low or binary one to be impressed on the write enable terminal of the access memory 7. This signal would then be written into the accessed address location and cause a binary one flag indicative or the write operation to be stored. Upon each successive attempt at accessing that address location during the write protect interval, logic gate 13 would be made and a write abort would occur in each instance.

During the initialize period of each cycle of the overwrite timer 9, the system control circuitry (not shown) causes address signals to be produced on the BSU address bus 15 so as to access each address of the access memory 7. Upon each access operation, the contents of each memory location are cleared to binary zeros so that during the next write protect period each location may again be flagged. The description of this control circuitry will, however, be described in greater detail hereinafter with reference to FIG. 2.

Figure 2:
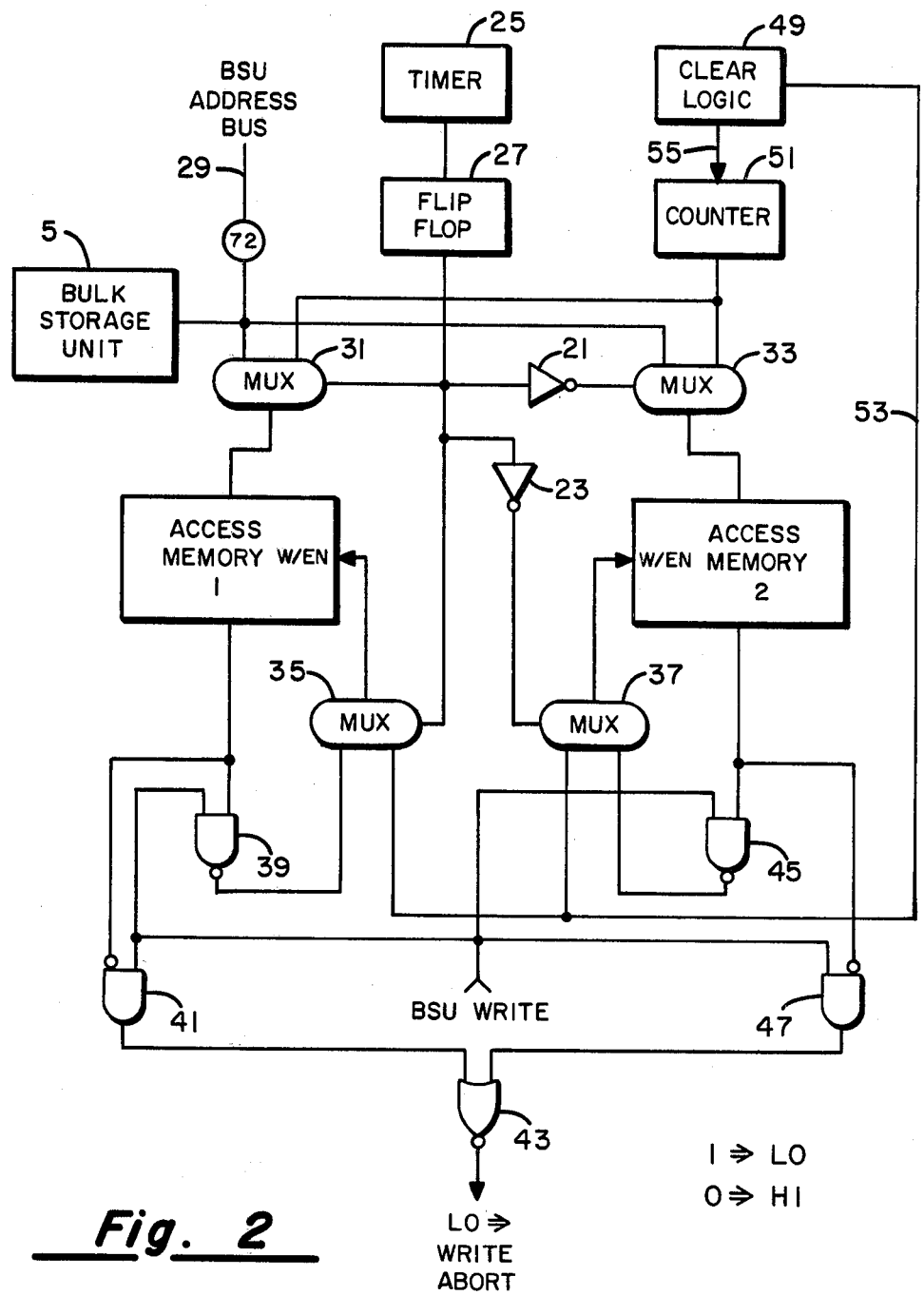
FIG. 2 is a block diagram of an alternative embodiment that provides continuous over-write protection via alternate access memories.

While the apparatus of FIG. 1 provides a definite advantage for systems in which the temptation exists for using an MNOS type BSU 5 as a scratch pad memory, it suffers from the disadvantage of not providing protection during each initialize period of each cycle. In FIG. 2, however, an alternative scheme is shown for continuous over-write protection. This scheme employs two access memories that are operated in an overlap fashion that one of the access memories will always be operative to detect over-write conditions. It should be noted that numerous overlap schemes exist for ensuring that one of the access memories is operating within its overwrite period. This overlapping may occur through sophisticated timing circuitry, but the preferred embodiments employs a relatively simplistic arrangement, whereby a flip-flop and some inverters and multiplexers are used to ensure that one of the access memories is always operating within the write protect period of its cycle.

In particular, referring to FIG. 2 and waveforms (b) and (c) of FIG. 3, the operation of the alternative embodiment will now be described. From the waveforms (b) and (c) and which are respectively associated with access memories 1 and 2 it can be seen that the duration of the write protect and initialize periods associated with the access memory 1 are the inverse of the write protect and initialize periods associated with access memory 2. This inverse relationship results from the coupling of the inverters 21 and 23 to the timing signal produced by the over-write timer 25 and the flip-flop 27. The inversion of the timing signal from the flip-flop 27 thus enables access memory 1 to operate inversely to access memory 2.

As mentioned, it is to be recognized that other timing schemes may be employed such as where the initialize and write protect periods of the access memories 1 and 2 overlap, but such circuitry increases the complexity of the design and is typically not required. The primary concern being that continuous over-write protection be provided in as simple a manner as possible. It is also to be recognized that thought must be given to the system configuration so that neither too long an over-write period nor too short an over-write protect period be provided. While the intent is to prevent over-writing, it is also undesirable to preclude writing altogether. Therefore it is necessary to adjust the amount of overlap between the initialize and write protect period of the access memories 1 and 2 so that neither is always full or empty upon starting its write protect interval.

The operation of the alternative embodiment of FIG. 2 is essentially the same as that for the embodiment of FIG. 1, but because of the overlapped timing requirements, it is necessary to multiplex the operations during the initialize and write protect periods of each cycle for each access memory 1 or 2. In this regard, the operation of the circuitry differs slightly and which will now be described in greater detail. Specifically upon receipt of an address by the BSU address bus 29, the address will again be impressed on the BSU 5 as well as one or the other or both of the access memories 1 and 2. Which memory will receive the address value will be dependent upon the timing of waveforms (b) and (c), but for the present alternative embodiment, only one of the access memories will receive the address at any one time, due to the inverse operation of the multiplexers 31 and 33. Thus only one of the multiplexers will be enabled and permit the address value on the BSU address bus 29 to be transmitted to the associated access memory. Depending upon which the access memories receives the address value, the associated multiplexers 35 and 37 will be enabled so as to permit the access memories to operate in the identical fashion as previously described with respect to FIG. 1. Thus, if access memory 1 is operating within its write protect period, multiplexers 31 and 35 will be enabled to permit the receipt of address values from the BSU address bus 29 and the writing of the binary one flag, when a binary zero flag is detected, upon the first writing of each access memory location. The logic gates 39 and 41 would again act in the same fashion as the logic gates 11 and 13, but when a flag is detected, the write abort signal from the logic gate 41 would now be impressed upon the NOR logic gate 43 so as to produce a logic low write abort signal. Similarly the access memory 2 would, upon detecting a binary one flag, operate via its logic gates 45 and 47 to produce a similar write abort signal, when and if a second write access were to occur during its write protect period.

It is to be noted that from the circuitry of FIG. 3 and depending upon the overlapped operation of the access memories 1 and 2, it is possible to simultaneously receive logic signals from logic gates 41 and 47 at the NOR logic gate 43 and cause a write abort signal. If the access memories are overlapped so that this condition can occur, it is to be recognized that the timing of the circuitry must be adjusted so that each of the access memories are in synchronization relative to the outputs from the logic gates 41 and 47. It is also to be noted that during overlapped operation, it is also possible that only one of the logic gates 41 or 47 would operate, since one of the access memories may have just been initialized so that it would not detect the second write, whereas the other access memory would still be in the write protect period. Because of these above referenced complexities, the present apparatus was designed to operate in an inverse fashion so that the write protect period of one access memory ends when the write period of the other access memory begins, thus providing a simplistic, continuous over-write protection.

Attention is also directed to the initialize control circuitry, comprised of clear logic 49 and counter 51. The initialize control circuitry of FIG. 2 is generally always operative with counter 51 successively counting up and producing the various address values for each memory location of each access memory during its respective initialization period. The inverse operation of the multiplexers 31 and 33 thus permits the counter 51 values to be impressed upon only one of the access memories at a time. At the same time, the multiplexer 35 or 37 associated with that memory permits the signal from the clear logic 49 on conductor 53 to be coupled to the write enable terminal of the access memory being initialized. This write enable signal is typically a binary zero and acts to clear the contents of all the memory locations as the counter 51 completes its count.

Recognizing that the initialize period is typically shorter than the write protect period, as shown in FIG. 3 relative to access memories 1 and 2, it may also be desired that the clear logic 49 provide start and stop signals via conductor 55 to the counter 51 so that the counter will be properly synchronized to the initialize and write protect periods for the respective access memories 1 and 2. In particular with reference to the waveforms (b) and (c) of FIG. 3 and recognizing that the access memories 1 and 2 are identical and that the initialize period of each access memory is correspondingly identical, access memory 2 will always be initialized prior to the completion of the write protect period of access memory 1. Therefore, it may be desired to stop the counter 51 when the initialization operation is complete.

The alternative embodiments of FIGS. 1 and 2 thus essentially operate the same, but the circuitry of FIG. 2 essentially provides continuous over-write protection. It is to be recognized, though and as previously mentioned, that other variations may suggest themselves to those of skill in the art upon reading the above description, and therefore the following claims should be interpreted so as to include those equivalents that are apparent from the above description.

What is claimed is:

1. Over-write prevention apparatus comprising:
   means for producing an over-write time interval during the operation of a bulk storage unit (BSU);
   means for flagging each unique address of a SUM that is accessed during said over-write interval; and
   means responsively coupled to said flag means for interrupting and aborting any write instruction to said BSU if it is to an address thereof that has been previously accessed during any given over-write interval.

2. Over-write protection apparatus comprising:
   means for producing over-write time intervals during the operation of a bulk storage unit (BSU);
   first and second means for flagging each unique address of said BSU that is accessed during any of said over-write intervals;
   means for controlling said first and second flag means so that during any over-write interval at least one of said flag means flags each unique address accessed while the other flag means is initialized, thereby providing continuous over-write protection for all over-write intervals; and
   third and fourth means respectively and responsively coupled to said first and second means for interrupting and aborting any write instruction to said BSU if it is to an address thereof that was previously accessed during any given over-write interval.

* * * * *